US012785044B2

(12) United States Patent
Sahu et al.

(10) Patent No.: US 12,785,044 B2
(45) Date of Patent: Nov. 3, 2026

(54) SEMICONDUCTOR MANUFACTURING PROCESS CHAMBER COOLING FLANGE FOR REMOTE PLASMA SOURCE SUPPLY

(71) Applicant: Applied Materials, Inc., Santa Clara, CA (US)

(72) Inventors: Amit Sahu, Bangalore (IN); Shashidhara Patel H B, Bangalore (IN); Muhannad Mustafa, Milpitas, CA (US); Rakesh Ramadas, San Jose, CA (US); Sanjeev Baluja, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 645 days.

(21) Appl. No.: 18/209,716

(22) Filed: Jun. 14, 2023

(65) Prior Publication Data

US 2024/0420924 A1 Dec. 19, 2024

(51) Int. Cl.
*H01J 37/32* (2006.01)
*H10P 72/00* (2026.01)

(52) U.S. Cl.
CPC .... *H01J 37/3244* (2013.01); *H01J 37/32357* (2013.01); *H10P 72/0402* (2026.01); *H01J 2237/002* (2013.01); *H01J 2237/332* (2013.01)

(58) Field of Classification Search
CPC ............. H01J 37/3244; H01J 37/32357; H01J 2237/002; H01J 2237/332; H01J 37/32522; H01J 37/321; H01J 37/32082; H01J 37/32174; H01J 37/32009; H01J 37/32018; H01J 37/32027; H01J 37/32036; H01J 37/3211; H01J 37/32119; H10P 72/0402; C23C 16/507; C23C 16/455; C23C 16/45591; C23C 16/4412; C23C 16/452
USPC ............ 118/723 ME, 723 ER, 723 IR, 723 I; 156/345.35, 345.48, 345.49
See application file for complete search history.

(56) References Cited

U.S. PATENT DOCUMENTS

| | | | | |
|---|---|---|---|---|
| 5,332,442 A * | 7/1994 | Kubodera | C23C 16/45512 | 118/728 |
| 5,453,124 A * | 9/1995 | Moslehi | C23C 16/45561 | 118/725 |
| 5,950,925 A * | 9/1999 | Fukunaga | C23C 16/45574 | 239/428 |

(Continued)

FOREIGN PATENT DOCUMENTS

| | | |
|---|---|---|
| CN | 112233961 A | 1/2021 |
| JP | H01283315 A | 11/1989 |

OTHER PUBLICATIONS

Science Direct, Gas Turbine Engineering Handbook (Fourth Edition), 2012, Abstract, 8 pages.

(Continued)

*Primary Examiner* — Rudy Zervigon
(74) *Attorney, Agent, or Firm* — SERVILLA WHITNEY LLC

(57) ABSTRACT

Cooling flanges and semiconductor manufacturing processing chamber comprising the cooling flanges are disclosed. The cooling flanges comprise a flange body with a gas channel extending through the length thereof. The gas channel has an inlet funnel, a middle channel and an outlet funnel with a purge gas inlet in a side of the flange body. The purge gas inlet connects to the middle channel of the gas channel.

24 Claims, 5 Drawing Sheets

(56) References Cited

U.S. PATENT DOCUMENTS

| | | | | |
|---|---|---|---|---|
| 6,369,493 | B1 * | 4/2002 | Lubomirsky ..... | H01J 37/32522 315/111.21 |
| 6,387,182 | B1 * | 5/2002 | Horie ................ | C23C 16/45563 427/349 |
| 6,726,803 | B2 * | 4/2004 | Kondo .............. | H01J 37/32357 156/345.43 |
| 7,204,886 | B2 * | 4/2007 | Chen ................. | C23C 16/45561 118/715 |
| 7,476,291 | B2 * | 1/2009 | Wang ...................... | H01J 37/16 438/689 |
| 10,407,771 | B2 * | 9/2019 | Cui ................... | C23C 16/45565 |
| 2002/0023589 | A1 * | 2/2002 | Kondo .............. | H01J 37/32082 118/723 ER |
| 2005/0251990 | A1 * | 11/2005 | Choi ..................... | C23C 16/455 29/458 |
| 2006/0048710 | A1 | 3/2006 | Horiguchi et al. | |
| 2011/0303361 | A1 | 12/2011 | Ohmi et al. | |
| 2017/0137942 | A1 | 5/2017 | Kikuchi et al. | |
| 2020/0340138 | A1 | 10/2020 | Tolle et al. | |
| 2021/0249238 | A1 | 8/2021 | Matsuba et al. | |
| 2022/0064797 | A1 * | 3/2022 | Dhanakshirur ... | H01J 37/32522 |
| 2022/0122851 | A1 | 4/2022 | Ruan et al. | |

OTHER PUBLICATIONS

"PCT International Search Report and Written Opinion in PCT/US2024/034013 dated Oct. 7, 2024, 9 pages".

* cited by examiner

SEMICONDUCTOR MANUFACTURING PROCESS CHAMBER COOLING FLANGE FOR REMOTE PLASMA SOURCE SUPPLY

TECHNICAL FIELD

Embodiments of the disclosure are directed to cooling flanges for semiconductor manufacturing equipment. In particular, embodiments of the disclosure are directed to cooling flanges without isolation valves for remote plasma source (RPS) connection.

BACKGROUND

Reliably producing submicron and smaller features is one of the key requirements of very large scale integration (VLSI) and ultra large scale integration (ULSI) of semiconductor devices. However, with the continued miniaturization of circuit technology, the dimensions of the size and pitch of circuit features, such as interconnects, have placed additional demands on processing capabilities. The various semiconductor components (e.g., interconnects, vias, capacitors, transistors) require precise placement of high aspect ratio features. Reliable formation of these components is critical to further increases in device and density.

Additionally, the electronic device industry and the semiconductor industry continue to strive for larger production yields while increasing the uniformity of layers deposited on substrates having increasingly larger surface areas. These same factors in combination with new materials also provide higher integration of circuits per unit area on the substrate.

Some semiconductor manufacturing processes use remote plasma sources (RPS) for generation of a plasma that is flowed into the process region of a processing chamber. To maintain sufficient temperature control of the process within the processing chamber, a cooling flange is often positioned between the RPS and the processing chamber. Current cooling flanges positioned between the remote plasma source (RPS) and the processing chamber include an isolation valve to allow for an inert gas (e.g., argon (Ar)) purge. These isolation valves impose resistance to the flow of plasma from the RPS to the processing chamber and are inadequate for purging effectiveness. Additionally, current cooling flanges are constrained to lower temperatures (less than about 70° C.). Furthermore, the current cooling flanges provide a 2-point contact with mating processing chamber parts leading chamber-to-chamber temperature variations.

Accordingly, there is a need in the art for improved cooling flanges to connect the RPS to a semiconductor manufacturing process chamber.

SUMMARY

In some aspects, the techniques described herein relate to a cooling flange to connect a remote plasma source (RPS) to a semiconductor manufacturing processing chamber, the cooling flange including: a flange body with an inlet face and an outlet face defining a length of the cooling flange, an inlet flange on an inlet end of the flange body, the inlet flange including the inlet face and having an inlet flange thickness, an outlet flange on an outlet end of the flange body, the outlet flange including the outlet face and having an outlet flange thickness; a gas channel extending through the length of the flange body, the gas channel having an inlet opening in the inlet face of the flange body and an outlet opening in the outlet face of the flange body; and a purge gas inlet opening in a side of the flange body along the length of the flange body between the inlet flange and the outlet flange, the purge gas inlet opening in fluid communication with the gas channel.

In some aspects, the techniques described herein relate to a cooling flange to connect a remote plasma source (RPS) to a semiconductor manufacturing processing chamber, the cooling flange including: a flange body with an inlet face and an outlet face defining a length of the cooling flange, an inlet flange on an inlet end of the flange body, the inlet flange including the inlet face and having an inlet flange thickness, an outlet flange on an outlet end of the flange body, the outlet flange including the outlet face and having an outlet flange thickness; a gas channel extending through the length of the flange body, the gas channel having an inlet opening in the inlet face of the flange body and an outlet opening in the outlet face of the flange body, the gas channel having an inlet funnel, a middle tube and an outlet funnel, the middle tube connecting the inlet funnel with the outlet funnel; and a purge gas inlet opening in a side of the flange body along the length of the flange body between the inlet flange and the outlet flange, the purge gas inlet opening in fluid communication with the middle tube of the gas channel.

In some aspects, the techniques described herein relate to a semiconductor manufacturing processing chamber including: a chamber lid including a gas inlet, the gas inlet having an inlet opening in a top face of the chamber lid; a remote plasma source (RPS) above the chamber lid; and a cooling flange connecting the remote plasma source (RPS) to the chamber lid, the cooling flange including: a flange body with an inlet face and an outlet face defining a length of the cooling flange, an inlet flange on an inlet end of the flange body, the inlet flange including the inlet face and having an inlet flange thickness, an outlet flange on an outlet end of the flange body, the outlet flange including the outlet face and having an outlet flange thickness, a gas channel extending through the length of the flange body, the gas channel having an inlet opening in the inlet face of the flange body and an outlet opening in the outlet face of the flange body, and a purge gas inlet opening in a side of the flange body along the length of the flange body between the inlet flange and the outlet flange, the purge gas inlet opening in fluid communication with the gas channel, wherein the gas channel of the cooling flange is in fluid communication with the remote plasma source (RPS) and the gas inlet of the chamber lid.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

"Atomic layer deposition" or "cyclical deposition" as used herein refers to a process comprising the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber.

Figure 1:
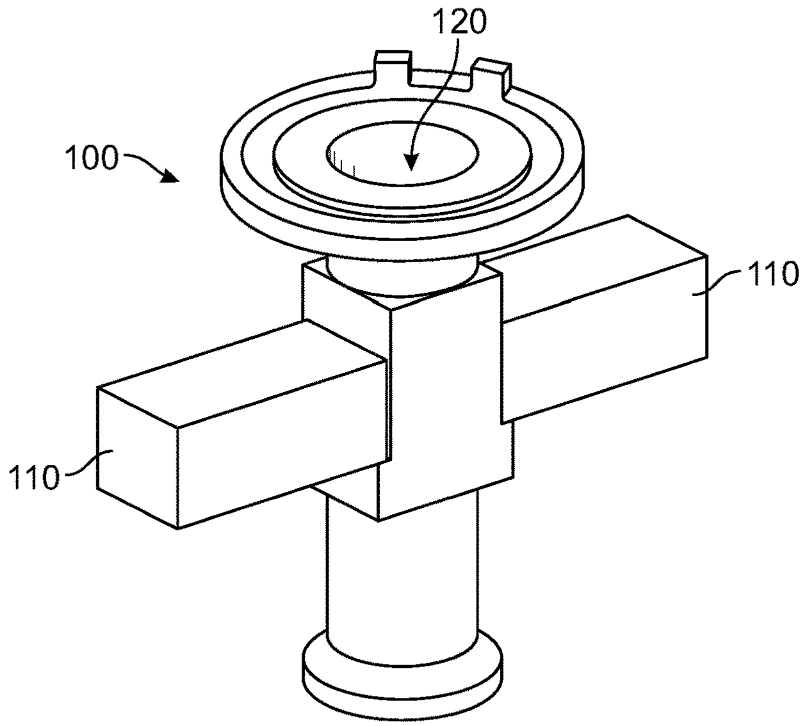
FIG. 1 (PRIOR ART)
FIGS. 1 and 2 illustrate a conventional cooling flange 100 that uses a combination of pneumatic valves 110 to control flow of plasma through the gas channel 120.
Figure 2:
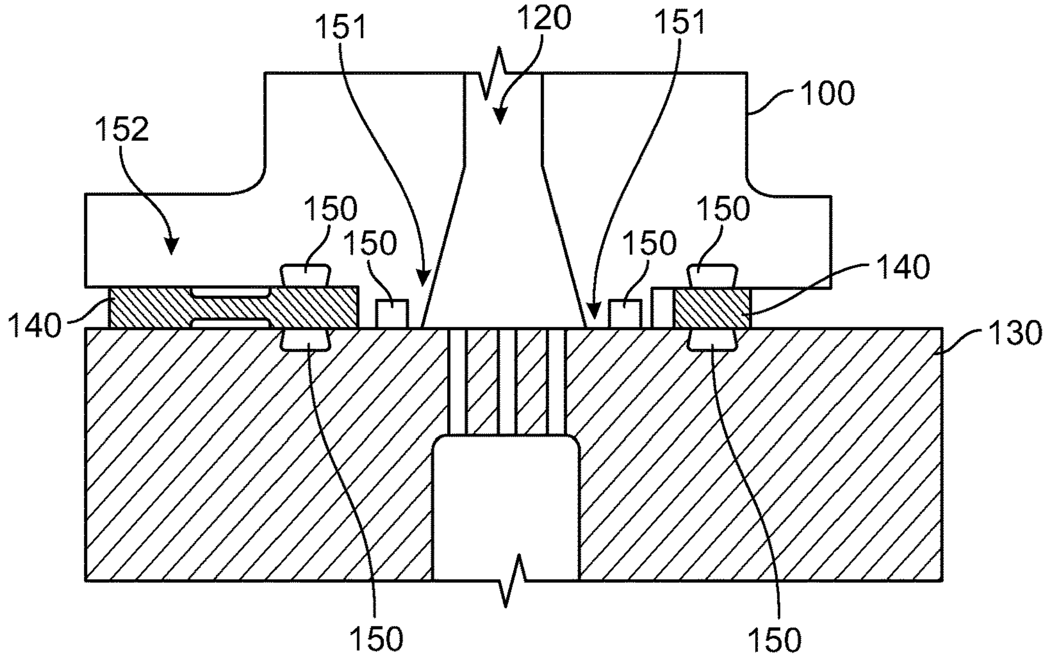
FIG. 2 (PRIOR ART)

FIGS. 1 and 2 illustrate a conventional cooling flange 100 that uses a combination of pneumatic valves 110 to control flow of plasma through the gas channel 120. The cooling flange 100 connects to the gas funnel 130 (or gas inlet) of the processing chamber. The gas funnel 130 of some embodiments is a component of the gas distribution system of the processing chamber and may include one or more additional components (e.g., a showerhead).

The cooling flange 100 connects to the gas funnel 130 through a flange 140. O-ring grooves 150 are formed in one or more of the bottom of the cooling flange 100, the top of the gas funnel 130, top of the flange 140 or bottom of the flange 140. The presence of the O-ring grooves 150 impacts the contact points between the cooling flange 100 and the gas funnel 130. In the conventional cooling flange illustrated, there are two points; a first contact point 151 and a second contact point 152. The first contact point 151 is between the gas channel 120 and the O-ring groove 150 on the bottom of the cooling flange 100, between the cooling flange 100 and the gas funnel 130. The second contact point 152 is at the outer edge of the cooling flange 100 outside the O-ring grooves 150 between cooling flange 100 and the flange 140. The region between the first contact point 151 and the second contact point 152 may not be completely sealed or have full contact, affecting the temperature control, resulting in chamber-to-chamber variations in temperature uniformity.

The pneumatic valves 110 all for the addition of an inert gas flow to the gas channel 120 either during flow of a plasma through the cooling flange 100, as a diluent gas, or without plasma flow, as a purge gas. The pneumatic valves 110 interrupt the flow path of the gas channel 120, causing inefficient purging of the cooling flange 100 and increasing turbulence of the flow from the plasma supply. Additionally, the pneumatic valves 110 impose temperature constraints on the cooling flange. The pneumatic valves 110 have a maximum operating temperature of about 70° C.

One or more embodiments of the disclosure advantageously provide cooling flanges that provide improved purging efficiency. Some embodiments advantageously provide an efficient flow of plasma without flow restrictions. Some embodiments advantageously provide cooling flanges with improved temperature constraints.

In some embodiments, the removal of the pneumatic isolation valves from the cooling flange removes the temperature constraint of 70° C., allowing for higher temperature processes.

In some embodiments, a single point contact between the cooling flange and the processing chamber is provided. The single point contact eliminates temperature fluctuation issues. In some embodiments, the cooling flange is in direct contact with the mixer and/or the lid of the processing chamber.

Some embodiments of the disclosure help avoid or minimize precursor back streaming towards the remote plasma source. The length of the cooling flange is configured to avoid back streaming of precursors.

Some embodiments of the disclosure provide for improved cooling flange purging efficiency by connecting the purge gas line closer to the inlet funnel and/or by removing the isolation valves. Without the isolation valves, the flow path of the plasma through the cooling flange is not obstructed, minimizing flow restrictions. Elimination of the isolation valves simplifies construction and costs of the cooling flange. Some embodiments reduce leakage points by eliminating the isolation valves.

Some embodiments avoid back streaming of gases into the RPS without the use of valves. Some embodiments allow for improved contact between the cooling flange and the mixer or process chamber lid reducing temperature variations and improving chamber-to-chamber matching.

Some embodiments of the cooling flange are designed in such a way, that the length of cooling flange is configured to eliminate back streaming of gases. Sufficient length of the cooling flange prevents back flow of precursors from getting close to the RPS generator. In some embodiments, use of hydrogen ($H_2$) as the purge gas shows negligible or no back diffusion of the precursor and with efficient purging from top completely restrict the diffusion of precursors.

When cooling is employed, a water channel can be used adjacent the RPS generator. The cooling channel can be moved to either or both ends of the flange. For purge gas, a direct gas line weldment can be connected to the cooling flange which reduces the flow path resistance.

Figure 3:
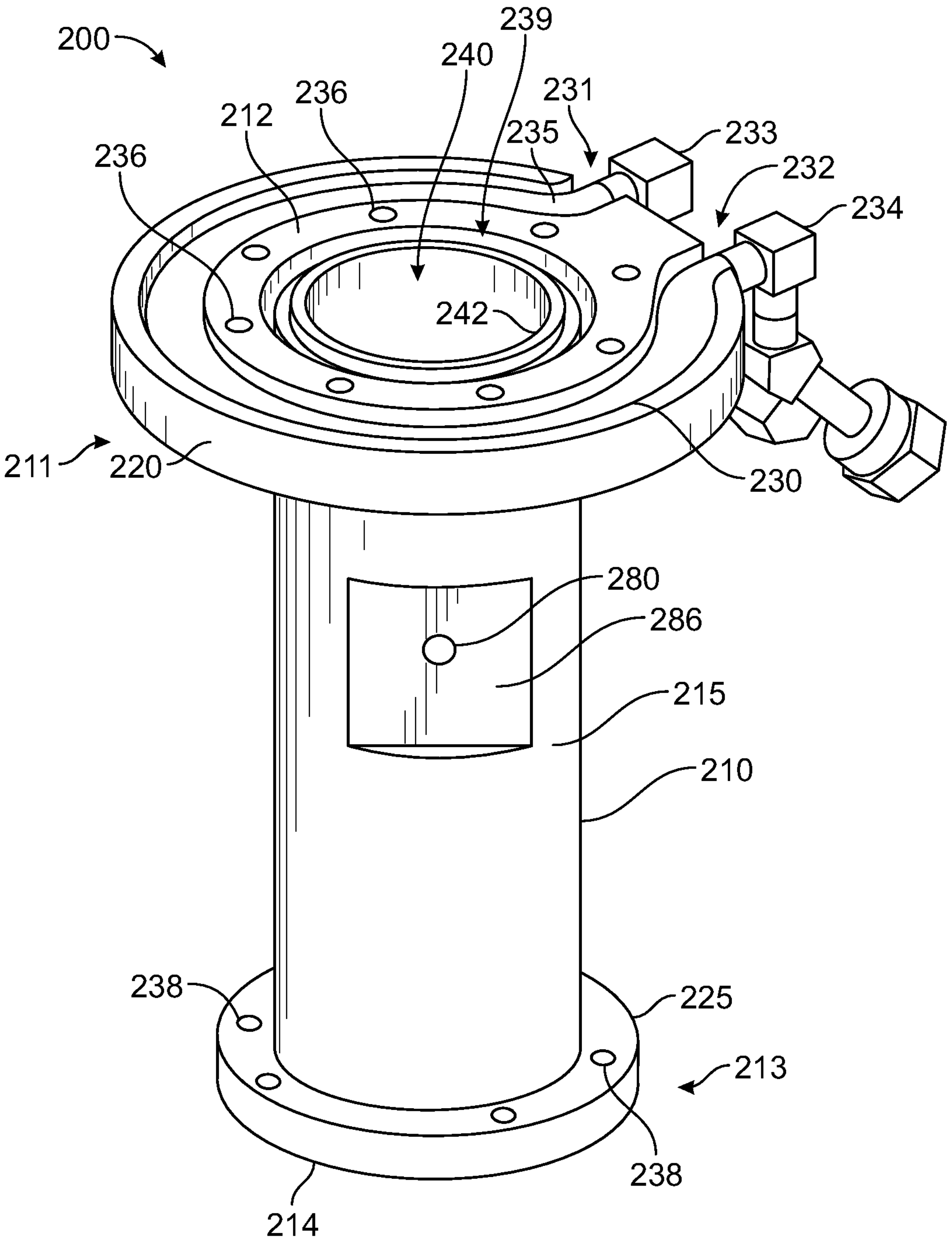
FIG. 3 illustrates an orthographic projection of a cooling flange 200 in accordance with one or more embodiments of the disclosure.
Figure 4:
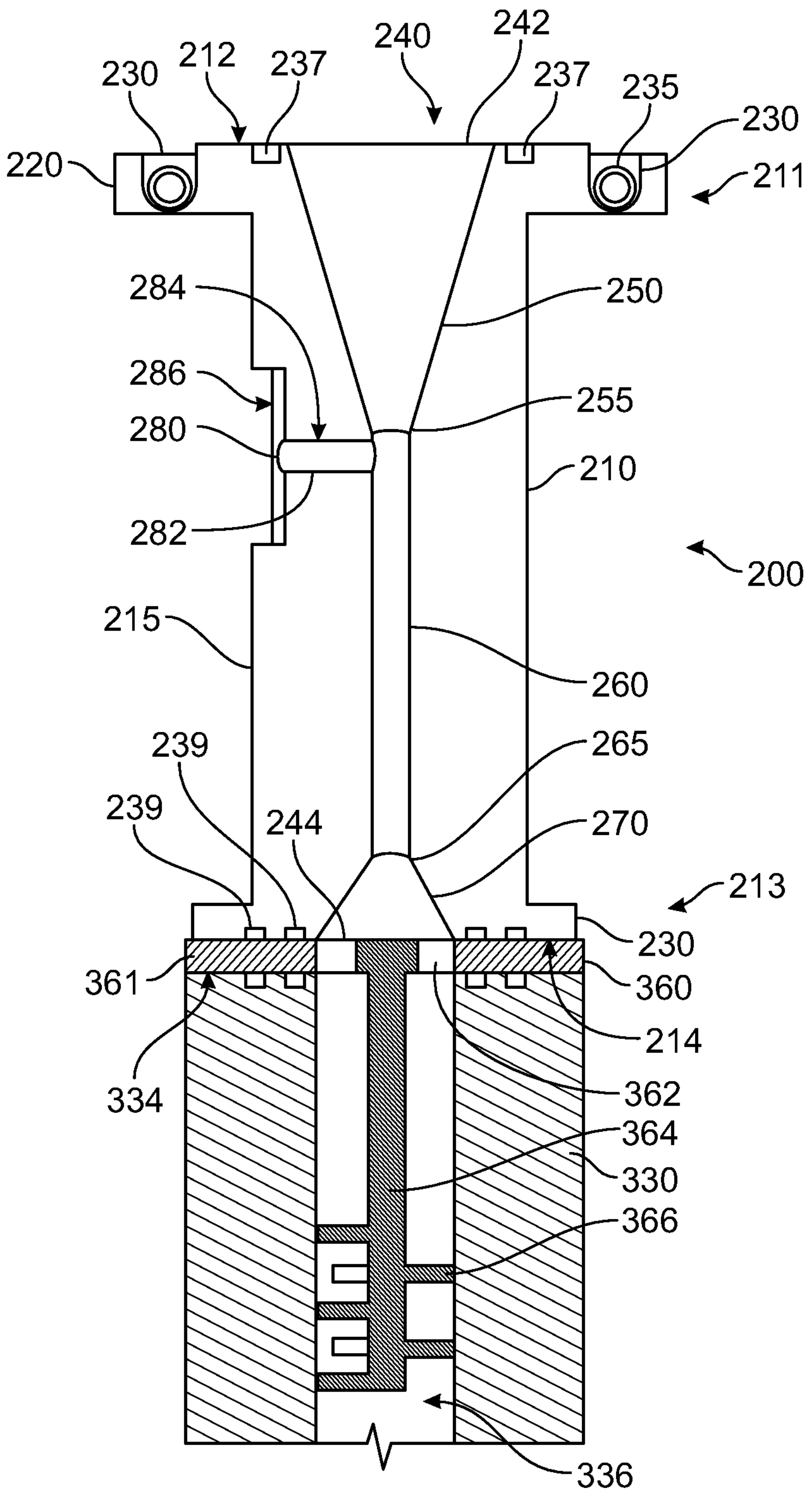
FIG. 4 is a cross-sectional schematic view of a cooling flange 200 connected to the gas inlet of a gas distribution assembly according to one or more embodiments of the disclosure.
Figure 5:
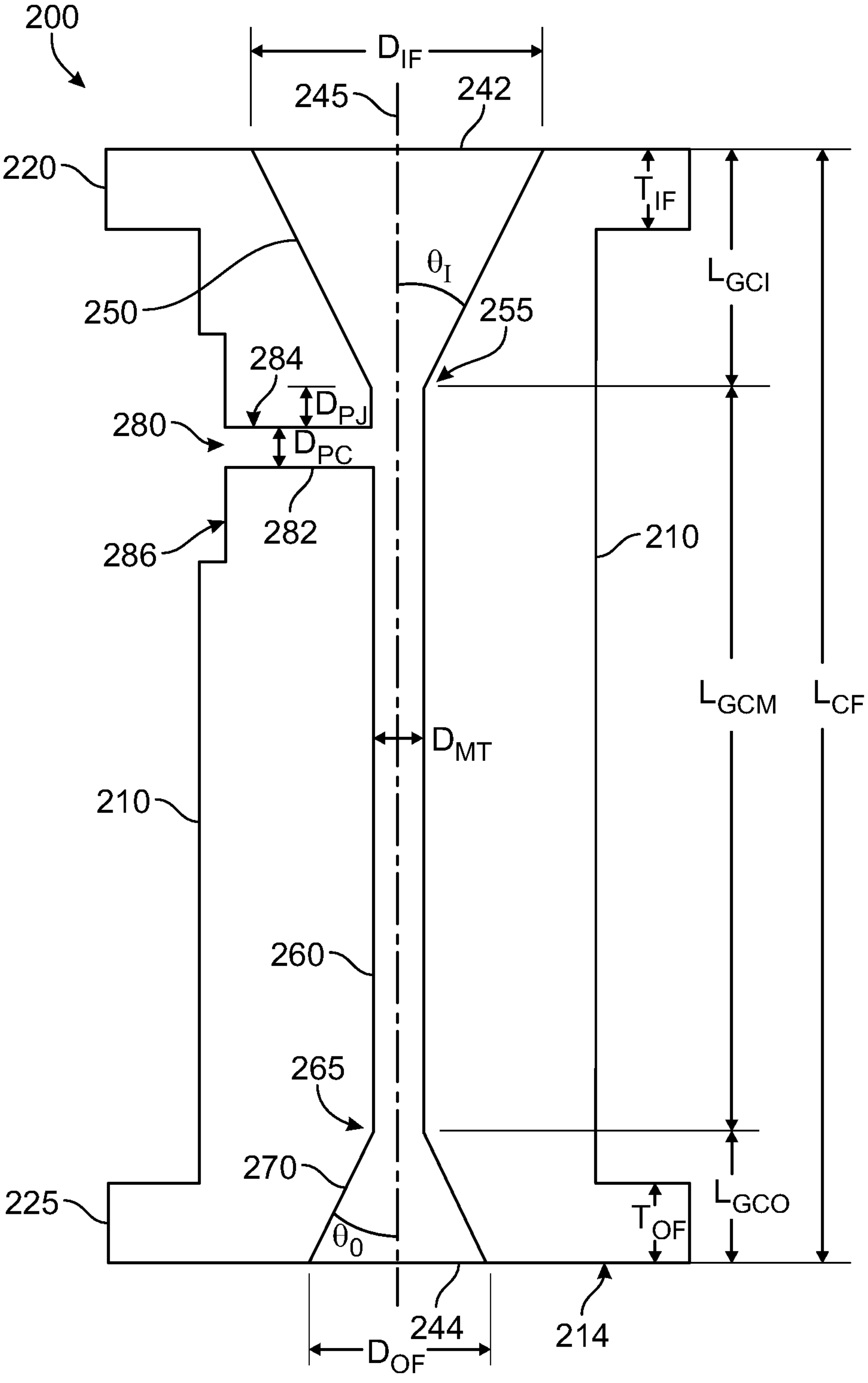
FIG. 5 is a cross-sectional schematic view of a cooling flange 200 according to one or more embodiments of the disclosure.

FIG. 3 illustrates an orthographic projection of a cooling flange 200 in accordance with one or more embodiments of the disclosure. FIG. 4 is a cross-sectional schematic view of a cooling flange 200 connected to the gas inlet of a gas distribution assembly according to one or more embodiments of the disclosure. FIG. 5 is a cross-sectional schematic view of a cooling flange 200 according to one or more embodiments of the disclosure.

Figure 6:
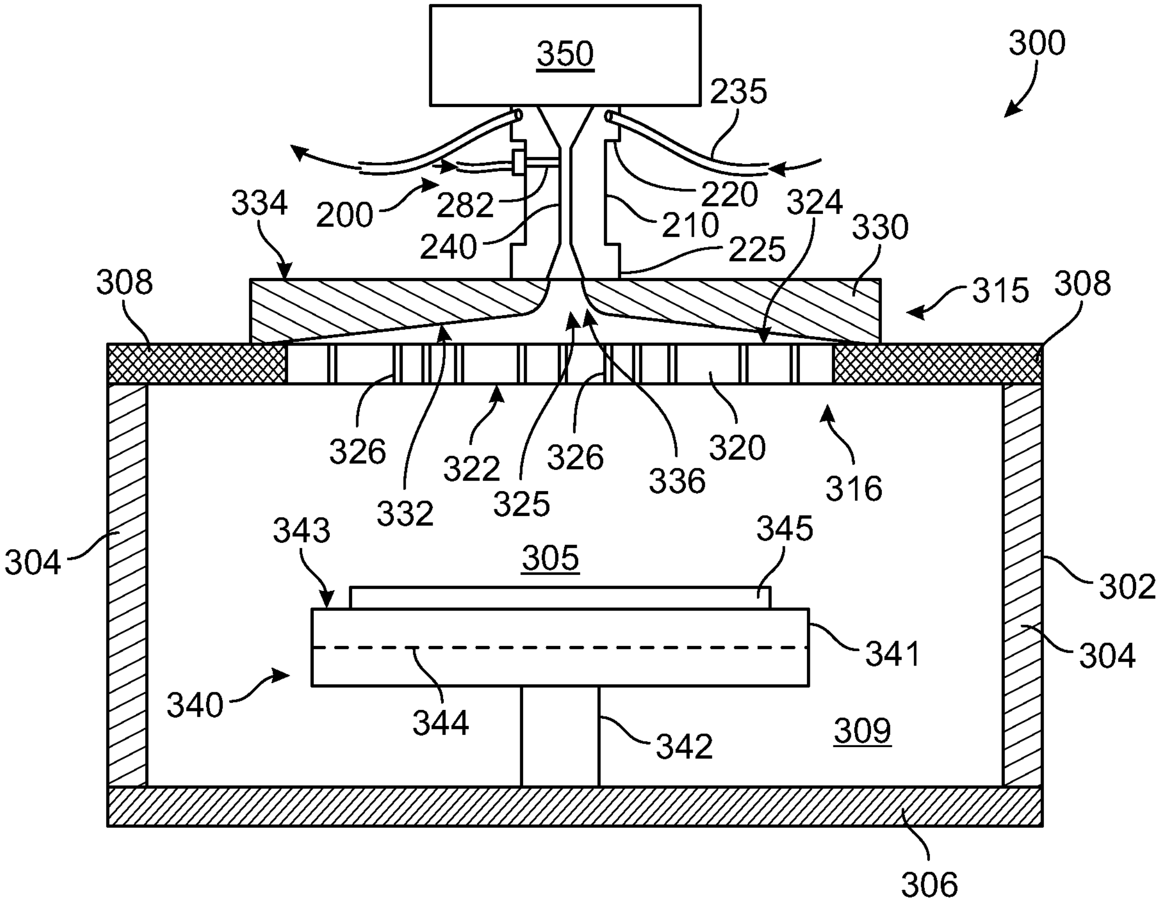
FIG. 6 illustrates a cross-sectional schematic view of a processing chamber 300 with remote plasma source 350 connected through a cooling flange 200 according to one or more embodiment of the disclosure.

The cooling flanges 200 of some embodiments are configured to connect a remote plasma source (RPS) 350 to a processing chamber 300. FIG. 6 illustrates a cross-sectional schematic view of a processing chamber 300 with remote plasma source 350 connected through a cooling flange 200 according to one or more embodiment of the disclosure.

Referring to FIGS. 3 through 5, one or more embodiments if the disclosure are directed to cooling flanges 200. The cooling flange 200 comprises a flange body 210. The flange body 210 has an inlet face 212 and an outlet face 214 that define a length $L_{CF}$ of the cooling flange 200.

In some embodiments, an inlet flange 220 is on an inlet end 211 of the flange body 210. The inlet flange 220 of some embodiments includes the inlet face 212 of the flange body 210. The inlet flange 220 has an inlet flange thickness $T_{IF}$.

In some embodiments, an outlet flange 225 is on the outlet end 213 of the flange body 210. The outlet flange 225 of some embodiments includes the outlet face 214 of the outlet face 214. The outlet flange 225 has an outlet flange thickness $T_{OF}$.

In some embodiments, the flange body 210 includes both an inlet flange 220 on the inlet end 211 and an outlet flange 225 on the outlet end 213.

The flange body 210 can be made of any suitable material known to the skilled artisan. In some embodiments, the flange body 210 comprises stainless steel or aluminum.

In some embodiments, one or more of the inlet flange 220 or the outlet flange 225 comprises a cooling channel 230 formed in the inlet face 212. The embodiments illustrated in FIGS. 3 and 4 include a cooling channel 230 in the inlet face 212 of the inlet flange 220. The skilled artisan will recognize that the arrangement of components illustrated in FIGS. 3 and 4 are merely representative of some possible configurations of the cooling flange 200 and will understand that construction of a similar cooling flange with cooling channel 230 on the outlet face 214 of the outlet flange 225.

The inlet end 211 of the illustrated embodiment includes the cooling channel 230 in the inlet face 212. The cooling channel 230 of some embodiments includes a cooling tube 235 that extends through the cooling channel 230 from a first end 231 of the cooling channel 230 to a second end 232 of the cooling channel 230. The embodiment illustrated in FIG. 3 shows a first cooling fitting 233 connected to the cooling tube 235 at the first end 231 and a second cooling fitting 234 connected to the cooling tube 235 at the second end 232. The cooling channel 230 can be any suitable dimensions based on, for example, the thickness of the flange that the cooling channel 230 is formed in and/or the size of the cooling tube 235 to be used. The cooling tube 235 can be made of any suitable material known to the skilled artisan. In some embodiments, the cooling tube 235 comprises a material with good thermal conductive properties to ensure sufficient thermal transfer between the flange body 210 and the cooling tube 235. Suitable cooling tubes materials include, but are not limited to, copper, stainless steel, aluminum, etc.

The inlet flange 220 illustrated includes a plurality of apertures 236 that can be used to connect the cooling flange 200 to a remote plasma source, as is described below. The outlet flange 225 illustrated includes a plurality of apertures 238 that can be used to connect the cooling flange 200 to a gas distribution assembly of a processing chamber, as is described below. The skilled artisan will recognize the manner in which the plurality of apertures 236 in the inlet flange 220 and the plurality of apertures 238 in the outlet flange 225 can be used to form the respective connections. For example, a suitable fastener (e.g., bolts) can be used with the plurality of apertures 236 in the inlet flange 220 or plurality of apertures 238 in the outlet flange 225 to connect the cooling flange 200 to the adjacent components.

The inlet end 211 of some embodiments, as shown in FIGS. 3 and 4, includes one or more O-ring groove 237. The O-ring groove 237 can be sized for any suitable O-ring known to the skilled artisan and can be used to help provide a fluid-tight seal between the inside of the O-ring and the outside of the O-ring. In some embodiments, the outlet end 213 of includes one or more O-ring groove 239. In the embodiment illustrated in FIG. 4, there are two O-ring grooves 239. In some embodiments, one of the O-ring grooves 239 in the outlet end 213 of the flange body 210 (i.e., in the outlet face 214 of the outlet flange 225) is a cooling channel similar to cooling channel 230 illustrated in the inlet flange 220.

A gas channel 240 extends through the length $L_{CF}$ of the flange body 210. The gas channel 240 has an inlet opening 242 in the inlet face 212 and an outlet opening 244 in the outlet face 214 of the flange body 210.

The length $L_{CF}$ of the flange body 210 is configured to avoid back streaming of precursor gases from the outlet opening 244 reaching the inlet opening 242. In some embodiments, the length of the cooling flange is greater than 2 inches, 3 inches, 4 inches or 5 inches. In some embodiments, the length of the cooling flange is less than 15 inches, 14 inches, 13 inches, 12 inches, 11 inches, or 10 inches. In some embodiments, the cooling flange has a length in the range of 2 inches to 15 inches, or in the range of 3 inches to 14 inches, or in the range of 4 inches to 12 inches, or in the range of 5 inches to 10 inches. In some embodiments, the length LCF of the flange body 210 of the cooling flange 200 is greater than or equal to 2 inches and less than or equal to 15 inches, or greater than or equal to 4 inches and less than or equal to 12 inches.

The gas channel 240 of some embodiments, as shown in FIGS. 4 and 5, comprises an inlet funnel 250, a middle tube 260 and an outlet funnel 270. The middle tube 260 connects the inlet funnel 250 with the outlet funnel 270. The length $L_{GCI}$ of the inlet funnel 250 is measured from the inlet opening 242 in the inlet face 212 to a transition 255 with the middle tube 260. The length $L_{GCO}$ of the outlet funnel 270 is measured from the outlet opening 244 in the outlet face 214 to a transition 265 with the middle tube 260. The length $L_{GCM}$ of the middle tube 260 is measured from the transition 255 with the inlet funnel 250 to the transition 265 with the outlet funnel 270.

The inlet funnel 250 is shaped with a largest diameter at the inlet opening 242 and the smallest diameter at the transition 255 with the middle tube 260. The inlet angle $\Theta_I$ is measured relative to the central axis 245 of the gas channel 240. The inlet angle $\Theta_I$ of the inlet funnel 250, according to some embodiments, is in the range of 15° to 55°, measured relative to the central axis 245 of the gas channel 240. In some embodiments, the angle $\Theta_I$ is in the range of 20° to 45°, or about 30°.

The inlet diameter $D_{IF}$ is measured as the widest part of the inlet funnel 250 located at the inlet opening 242. The inlet diameter $D_{IF}$ is also referred to as the maximum diameter at the inlet face 212 of the flange body 210. In some embodiments, the inlet diameter $D_{IF}$ is in the range of 1 inch to 3 inches, or in the range of 1.5 inches to 2.5 inches, or about 2 inches.

The outlet funnel 270 is shaped with the largest diameter at the outlet opening 244 and the smallest diameter at the transition 265 with the middle tube 260. The outlet angle $\Theta_O$ is measured relative to the central axis 245 of the gas channel 240. In some embodiments, the outlet angle $\Theta_O$ of the outlet funnel 270, according to some embodiments, is in the range of 30° to 70°, measured relative to the central axis 245 of the gas channel 240. In some embodiments, the angle $\Theta_O$ is in the range of 40° to 60°, or in the range of 50° to 55°.

The outlet diameter $D_{OF}$ is measured as the widest part of the outlet funnel 270 located at the outlet opening 244. The outlet diameter $D_{OF}$ is also referred to as the maximum diameter at the outlet face 214 of the flange body 210. In some embodiments, the maximum diameter at the outlet face 214 (the outlet diameter $D_{OF}$) is in the range of 0.5 inches to 2 inches, or in the range of 1 inch to 1.5 inches or about 1.25 inches.

The middle tube 260 connecting the inlet funnel 250 with the outlet funnel 270 of some embodiments has a substantially uniform diameter $D_{MT}$ along the length $L_{GCM}$ of the middle tube 260. As used in this manner, a "substantially uniform diameter" varies at any point along the length $L_{GCM}$ by less than or equal to 10% relative to the average diameter. In some embodiments, the diameter $D_{MT}$ has a diameter in the range of 0.2 inches to 0.5 inches, or in the range of 0.3 inches to 0.4 inches.

Referring again to FIGS. 3 through 5, some embodiments of the disclosure include a purge gas inlet opening 280 in a side 215 of the flange body 210. The purge gas inlet opening 280 is positioned along the length $L_{CF}$ of the flange body 210 between the inlet flange 220 and the outlet flange 225. The purge gas inlet opening 280 is in fluid communication with the gas channel 240 through purge gas channel 282.

The purge gas channel 282 can be connected to the gas channel 240 at any point along the length $L_{CF}$ of the flange body 210. In some embodiments, the purge gas inlet opening 280 is in fluid communication through the purge gas channel 282 with the middle tube 260 of the gas channel 240.

The location of the junction between the purge gas channel 282 and the middle tube 260 may affect the backflow of precursors from the outlet face 214 of the flange body 210 flowing backward to the inlet face 212 and into the remote plasma source connected to the inlet face 212. In some embodiments, the purge gas inlet opening 280 connects to the middle tube 260 of the gas channel 240 at a distance $D_{PJ}$ within 1 inch of the inlet funnel 250. The distance $D_{PJ}$ is measured from the transition 255 between the inlet funnel 250 and the middle tube 260 to the edge 284 of the purge gas channel 282 closest to the transition 255. In some embodiments, the distance $D_{PJ}$ is less than or equal to 2.5 inches, 2 inches, 1.5 inches, 1 inch, 0.75 inches, 0.5 inches or 0.25 inches.

The diameter of the purge gas inlet channel 282 is configured to provide a sufficient flow of purge gas into the gas channel 240 to prevent backflow of precursor through the flange body 210. In some embodiments, the purge gas inlet channel 282 has a diameter $D_{PC}$ in the range of 0.25 inches to 1.5 inches, or in the range of 0.5 inches to 1.25 inches, or in the range of 0.75 inches to 1 inch. In some embodiments, the diameter $D_{PC}$ of the purge gas inlet channel 282 is greater than or equal to the diameter $D_{MT}$ of the middle tube 260.

In some embodiments, the purge gas inlet opening 280 is in a flat face 286 in the cylindrical wall (side 215) of the flange body 210. The flat face 286 formed in the side 215 provides a location for the attachment of a gas inlet valve (not shown) to the flange body 210 of the cooling flange 200.

FIG. 6 illustrates a schematic representation of a semiconductor manufacturing processing chamber 300 in accordance with one or more embodiments of the disclosure. The processing chamber 300 includes a chamber body 302 with a sidewall 304, bottom 306 and chamber lid 308 that enclose an interior 309 of the chamber. The chamber body 302 can be made of any suitable material known to the skilled artisan. For example, the chamber body 302 in some embodiments is made of stainless steel. The various components of the embodiments illustrated in the Figures have different cross-hatching for visualization purposes. The different cross-hatching is only to make it easier to distinguish between parts and is not related to the materials of construction.

The chamber lid 308 of some embodiments includes a gas distribution assembly or gas injector, as will be understood by the skilled artisan. The chamber lid 308 of some embodiments comprises a gas inlet 315. The gas inlet 315 includes an inlet opening 316 in the chamber lid 308.

In the illustrated embodiment the inlet opening 316 includes a gas distribution assembly configured to provide a flow of one or more gases into the interior 309 of the semiconductor manufacturing processing chamber 300. In some embodiments, the gas distribution assembly includes a showerhead 320 located within the interior 309 semiconductor manufacturing processing chamber 300. In the illustrated embodiment, the showerhead 320 is connected to the chamber lid 308 and is coplanar with the chamber lid 308. However, the skilled artisan will recognize that this arrangement is merely an example of one possible configuration and that the showerhead 320 can be within the interior 309 of the semiconductor manufacturing processing chamber 300 or part of the chamber lid 308 that bound the interior 309. The showerhead 320 is part of the gas distribution assembly and may be referred to as a gas distribution plate.

The showerhead 320 has a front surface 322 and a back surface 324 that define the thickness of the showerhead 320. A plurality of apertures 326 extend through the thickness of the showerhead 320. The plurality of apertures 326 allow a gas to flow from the region adjacent the back surface 324 to the interior 309 of the semiconductor manufacturing processing chamber 300 through the showerhead 320.

The showerhead 320 can be made of any suitable material known to the skilled artisan. In some embodiments, the showerhead 320 is made of a conductive material that can be used to generate a plasma within the interior 309 of the semiconductor manufacturing processing chamber 300. In some embodiments, the showerhead 320 comprises one or more of stainless steel or aluminum.

A gas funnel 330 is positioned on the showerhead 320. The gas funnel 330 has a front surface 332 and a back surface 334. An opening 336 extends through the center of the gas funnel 330. The front surface 332 of some embodiments has a concave-shaped inner portion and a flat outer portion. The flat outer portion of the front surface 332 of the gas funnel 330 is in contact with the back surface 324 of the showerhead 320 to form a gas plenum between the back surface 324 of the showerhead 320 and the concave-shaped inner portion of the front surface 332 of the gas funnel 330.

A substrate support 340 is located within the interior 309 of the semiconductor manufacturing processing chamber 300. The substrate support 340 of some embodiments comprises a support body 341 positioned on a support shaft 342. The support body 341 has a support surface 343 configured to support a semiconductor wafer 345 for processing. The support shaft 342 of some embodiments is configured to move the support body 341 closer to/further from the showerhead 320 and/or around a rotational axis of the support shaft 342.

In some embodiments, the support body 341 includes a thermal element 344 configured to heat the semiconductor wafer 345 on the support surface 343. The thermal element 344 can be any suitable heating mechanism known to the skilled artisan. For example, in some embodiments, the thermal element 344 comprises a resistive heating element that is connected to a power supply (not shown) configured to apply power to the thermal element 344 to heat the support body 341. In some embodiments, the support body 341 includes an electrostatic chuck (ESC) (not shown). The skilled artisan will be familiar with the construction of the ESC and the manner in which the ESC is powered and employed.

The semiconductor manufacturing processing chamber 300 of some embodiments, as shown in FIG. 6, includes a remote plasma source (RPS) 350 positioned above the chamber lid 308. As used in this manner, the direction term "above" is used to describe the location of the remote plasma source 350 relative to the chamber lid 308 on the page of the Figure. The skilled artisan will recognize that the arrangement of components in the processing chamber can be varied so that the entire chamber is inverted or turned sideways without deviating from the scope of the disclosure. The remote plasma source 350 can be any suitable plasma source known to the skilled artisan.

The cooling flange 200 connects the remote plasma source (RPS) 350 to the chamber lid 308. The cooling flange 200 illustrated has an inlet flange 220 and outlet flange 225. The inlet flange 220 is connected to the remote plasma source 350 and the outlet flange 225 is connected to the gas funnel 330 of the gas distribution assembly. In use, a plasma generated in the remote plasma source 350 flows through the gas channel 240 of the cooling flange 200 into the opening 336 in the back surface 334 of the gas funnel 330, into the plenum 325 between the front surface 332 of the gas funnel 330 and the back surface 324 of the showerhead 320, and then through the plurality of apertures 326 in the showerhead 320 into the process region 305 between the substrate support 340 and the showerhead 320.

In some embodiments, a purge gas flow is provided through the purge gas inlet opening 280 into the purge gas channel 282, and then into the gas channel 240. The purge gas flows through the gas channel 240 of the cooling flange 200 into the gas funnel 330 of the semiconductor manufacturing processing chamber 300. The purge gas flow can be provided in a constant flow, in pulses or varied. In some embodiments, the purge gas flow is provided through the cooling flange 200 into the gas funnel 330 when the remote plasma source 350 is not powered so that a flow of inert gas flows into the interior 309 of the semiconductor manufacturing processing chamber 300 through the showerhead 320 even without a plasma flow. In some embodiments, the remote plasma source 350 is used as a passthrough for a process gas that is not ignited into a plasma. The non-plasma process gas flows into the cooling flange 200 and is joined with the purge gas flow in the gas channel 240 to flow into the gas funnel 330.

In the embodiment illustrated in FIG. 6, the cooling flange 200 is connected directly to the back surface 334 of the gas funnel 330 by any suitable connector known to the skilled artisan. In some embodiments, the cooling flange 200 is connected to the gas funnel 330 using a plurality of bolts extending through the plurality of apertures 238 of the outlet flange 225 of the flange body 210 (see FIG. 3). In some embodiments, an O-ring positioned in the one or more O-ring groove 239 in the outlet face 214 of the outlet end 213 of the outlet flange 225 (see FIG. 4) helps to form a fluid-tight seal between the gas channel 240 and the outside environment. The cooling flange 200 is connected to the gas funnel 330 by a single point contact between the outlet flange 225 and the gas funnel 330. The inventors have found that manufacturing cooling flanges with multiple contact surfaces is impractical due at least in part to the tolerance requirements to ensure proper contact at more than one surface.

A cooling tube 235 is illustrated in FIG. 6 as being connected to the inlet flange 220 of the flange body 210. A flow of a cooling fluid is passed through the cooling tube 235 so that the cooling fluid flow around the inlet flange 220 between the remote plasma source 350 and the remainder of the flange body 210 below the inlet flange 220. In some embodiments, the cooling fluid is connected to a recirculation system (not shown) to reuse the cooling fluid repeatedly while maintaining a consistent temperature for the cooling fluid and without contamination concerns. The cooling fluid can be any suitable fluid known to the skilled artisan for cooling purposes. For example, a liquid with a relatively high heat capacity compared to water (e.g., ethylene glycol or an aqueous solution of ethylene glycol) may be advantageously used to efficiently remove heat buildup in the inlet flange 220 from the remote plasma source 350.

Referring back to FIG. 4, in some embodiments, the cooling flange 200 is connected to the gas funnel 330 through a mixer 360. The mixer 360 is a component positioned adjacent the back surface 334 of the gas funnel 330 with a leg 364 that extends from a mixer flange 361 into the inlet opening 336 of the gas funnel 330. A plurality of apertures 362 in the mixer flange 361 allow a flow of gas to pass from the cooling flange 200 into the gas funnel 330. The leg 364 in the illustrated embodiment has a plurality of baffles 366 positioned at an end of the mixer 360 inside the inlet opening 336. The plurality of baffles 366 cause turbulence in the flow of gas through the inlet opening 336 to mix the gaseous components of the flow more thoroughly. In the embodiment illustrated in FIG. 4, the cooling flange 200 is connected to the gas funnel 330 through the mixer flange 361 of the mixer 360 with a single point contact, the outlet face 214 of the outlet end 213 of the flange body 210. In some embodiments, the baffles 366 are positioned 180° apart to increase mixing and turbulence within the gas flow.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A cooling flange configured to be connected to a remote plasma source (RPS) and to a semiconductor manufacturing processing chamber, the cooling flange comprising:

a flange body with an inlet face and an outlet face, an inlet flange on an inlet end of the flange body, the inlet flange including the inlet face and having an inlet flange thickness, an outlet flange on an outlet end of the flange body, the outlet flange including the outlet face configured to be connected to the semiconductor manufacturing processing chamber and having an outlet flange thickness;

a gas channel extending through a length of the flange body, the gas channel having an inlet opening in the inlet face of the flange body, an outlet funnel including an outlet opening in the outlet face of the flange body, the outlet funnel having a maximum diameter at the outlet face, and a middle tube connecting the inlet opening and the outlet funnel; and a purge gas inlet opening in a side of the flange body along the length of the flange body between the inlet flange and the outlet flange, the purge gas inlet opening in direct fluid communication with the gas channel via a purge gas inlet channel.

2. The cooling flange of claim 1, wherein the length of the flange body is configured to avoid back streaming of precursor gases from the outlet opening reaching the inlet opening, and the purge gas inlet channel is directly connected to the middle tube at a distance that prevents backflow of the precursor gases from the outlet face toward the inlet face.

3. The cooling flange of claim 1, wherein the length of the flange body is greater than or equal to 2 inches and less than or equal to 15 inches.

4. The cooling flange of claim 1, wherein the gas channel comprises an inlet funnel, the middle tube and the outlet funnel, the middle tube connecting the inlet funnel with the outlet funnel.

5. The cooling flange of claim 4, wherein the inlet funnel has an inlet angle in a range of 15° to 55°.

6. The cooling flange of claim 5, wherein the inlet funnel has a maximum diameter at the inlet face in a range of 1 inch to 3 inches.

7. The cooling flange of claim 4, wherein the middle tube has a diameter in a range of 0.2 inches to 0.5 inches.

8. The cooling flange of claim 4, wherein the outlet funnel has an outlet angle in a range of 30° to 70°.

9. The cooling flange of claim 8, wherein the outlet funnel has the maximum diameter at the outlet face in a range of 0.5 inches to 2 inches.

10. The cooling flange of claim 4, wherein the purge gas inlet channel has a diameter configured to provide a sufficient flow of gas into the gas channel to prevent backflow of precursor through the flange body.

11. The cooling flange of claim 10, wherein the purge gas inlet connects to the middle tube of the gas channel within 1 inch of the inlet funnel.

12. The cooling flange of claim 10, wherein the purge gas inlet comprises a flat face in a cylindrical wall of the flange body.

13. The cooling flange of claim 10, wherein the purge gas inlet has a diameter in a range of 0.25 inches to 1.5 inches.

14. A cooling flange configured to be connected to a remote plasma source (RPS) and to a semiconductor manufacturing processing chamber, the cooling flange comprising:

a flange body with an inlet face and an outlet face, an inlet flange on an inlet end of the flange body, the inlet flange including the inlet face and having an inlet flange thickness, an outlet flange on an outlet end of the flange body, the outlet flange including the outlet face configured to be connected to the semiconductor processing chamber and having an outlet flange thickness;

a gas channel extending through a length of the flange body, the gas channel having an inlet opening in the inlet face of the flange body and an outlet opening in the outlet face of the flange body, the gas channel having an inlet funnel, a middle tube and an outlet funnel, the middle tube connecting the inlet funnel with the outlet funnel, the outlet funnel having a maximum diameter at the outlet face, and the middle tube connecting the inlet opening and the outlet funnel; and a purge gas inlet opening in a side of the flange body along the length of the flange body between the inlet flange and the outlet flange, the purge gas inlet opening in direct fluid communication with the middle tube of the gas channel via a purge gas inlet channel.

15. The cooling flange of claim 14, wherein the length of the flange body is greater than or equal to 2 inches and less than or equal to 15 inches and the purge gas inlet channel is directly connected to the middle tube at a distance that prevents backflow of precursor gases from the outlet face toward the inlet face.

16. The cooling flange of claim 14, wherein the inlet funnel has an inlet angle in a range of 15° to 55°, and a maximum diameter at the inlet face in a range of 1 inch to 3 inches.

17. The cooling flange of claim 14, wherein the middle tube has a diameter in a range of 0.2 inches to 0.5 inches.

18. The cooling flange of claim 14, wherein the outlet funnel has an outlet angle in a range of 30° to 70°, and the maximum diameter at the outlet face in a range of 0.5 inches to 2 inches.

19. The cooling flange of claim 14, wherein the purge gas inlet connects to the middle tube of the gas channel within 1 inch of the inlet funnel.

20. A semiconductor manufacturing processing chamber comprising:

a chamber lid comprising a gas inlet, the gas inlet having an inlet opening in a top face of the chamber lid;

a remote plasma source (RPS) above the chamber lid; and a cooling flange connecting the remote plasma source (RPS) to the chamber lid, the cooling flange comprising:

a flange body with an inlet face and an outlet face, an inlet flange on an inlet end of the flange body, the inlet flange including the inlet face and having an inlet flange thickness, an outlet flange on an outlet end of the flange body, the outlet flange including the outlet face connected to the top face of the chamber lid and having an outlet flange thickness, a gas channel extending through a length of the flange body, the gas channel having an inlet opening in the inlet face of the flange body, an outlet funnel including an outlet opening in the outlet face of the flange body, the outlet funnel having a maximum diameter at the outlet face, and a middle tube connecting the inlet opening and the outlet funnel; and a purge gas inlet opening in a side of the flange body along the length of the flange body between the inlet flange and the outlet flange, the purge gas inlet opening in direct fluid communication with the gas channel via a purge gas inlet channel, wherein the gas channel of the cooling flange is in fluid communication with the remote plasma source (RPS) and the gas inlet of the chamber lid.

21. The semiconductor manufacturing processing chamber of claim 20, wherein the cooling flange is connected to the gas inlet of the chamber lid through a mixer positioned adjacent a back surface of a gas funnel on the chamber lid.

22. The semiconductor manufacturing processing chamber of claim 21, wherein the mixer comprises a leg that extends from a mixer flange into an inlet opening of the gas funnel, the leg including a plurality of baffles configured to cause turbulence in a flow of gas through the inlet opening of the gas funnel.

23. The semiconductor manufacturing processing chamber of claim 22, wherein the mixer flange comprises a plurality of apertures configured to allow a flow of gas to pass from the cooling flange into the gas funnel.

24. The semiconductor manufacturing processing chamber of claim 22, further comprising a showerhead comprising a back surface, a front surface and a plurality of apertures configured to allow a gas to flow from a region adjacent to the back surface of the showerhead and through the showerhead to an interior of the semiconductor manufacturing processing chamber.

* * * * *